US011312624B2

(12) United States Patent
Tseng et al.

(10) Patent No.: US 11,312,624 B2
(45) Date of Patent: Apr. 26, 2022

(54) MEMS DEVICE AND MANUFACTURING METHOD THEREOF

(71) Applicant: MIRAMEMS SENSING TECHNOLOGY CO., LTD, Suzhou Industrial Park (CN)

(72) Inventors: Li-Tien Tseng, Taoyuan (TW); Yu-Hao Chien, Taipei (TW)

(73) Assignee: MIRAMEMS SENSING TECHNOLOGY CO., LTD, Suzhou (CN)

( * ) Notice: Subject to any disclaimer, the term of this patent is extended or adjusted under 35 U.S.C. 154(b) by 328 days.

(21) Appl. No.: 16/714,440

(22) Filed: Dec. 13, 2019

(65) Prior Publication Data

US 2020/0115226 A1 Apr. 16, 2020

Related U.S. Application Data

(63) Continuation-in-part of application No. 15/600,060, filed on May 19, 2017, now abandoned.

(30) Foreign Application Priority Data

May 19, 2016 (CN) .......................... 201610334198.6

(51) Int. Cl.
*B81C 1/00* (2006.01)
(52) U.S. Cl.
CPC ...... *B81C 1/00357* (2013.01); *B81C 1/00079* (2013.01); *B81C 1/00095* (2013.01); *B81C 1/00222* (2013.01)
(58) Field of Classification Search
CPC ............ B81C 1/00357; B81C 1/00079; B81C 1/00095; B81C 1/00222;
(Continued)

(56) References Cited

U.S. PATENT DOCUMENTS

2015/0096376 A1 4/2015 Feyh et al.
2015/0158722 A1 6/2015 Lim et al.
(Continued)

FOREIGN PATENT DOCUMENTS

| CN | 102718179 B | 2/2016 |
| TW | I535038 B | 5/2016 |
| TW | I552945 B | 10/2016 |

*Primary Examiner* — Benjamin Tzu-Hung Liu
(74) *Attorney, Agent, or Firm* — Muncy, Geissler, Olds & Lowe, P.C.

(57) ABSTRACT

A manufacturing method of microelectromechanical system (MEMS) device includes providing a first, a second and a third substrates, wherein the first substrate includes a first and a second circuit, the second substrate includes second and third connection areas, and the third substrate includes first connection areas. Second grooves and a dividing groove are formed on the fourth surface of the third substrate. The second and third substrates are bonded to make the first and the second connection areas correspondingly connect with each other. The second substrate is divided to form electrically isolating first and second movable elements. The first movable element is spatial separated from the third substrate and corresponding to the second groove. The second movable element is connected to the third substrate. The first and the second substrates are bonded to make the fourth and the third connection areas connect correspondingly. The third substrate is thinned, divided into a first and a second cap from the dividing groove, and formed a first groove from the fifth surface. The first cap is corresponding to the first movable element and the first circuit. Air tight space to sense a pressure variation of exterior environment is formed between the first substrate and the second cap. The second movable element is movable with the second cap by the pressure variation of the exterior environment. Accordingly, the pressure sensor and the MEMS structure for sensing (Continued)

other physical quantity can be integrated in the foregoing MEMS device by a single process.

13 Claims, 5 Drawing Sheets

(58) Field of Classification Search
CPC ... B81C 2203/0118; B81B 3/001; B81B 7/02; B81B 2201/0235; B81B 2201/0242; B81B 2201/0264
See application file for complete search history.

(56) References Cited

U.S. PATENT DOCUMENTS

| | | | |
|---|---|---|---|
| 2015/0197419 A1* | 7/2015 | Cheng | B81C 1/0023 257/418 |
| 2015/0198493 A1* | 7/2015 | Kaelberer | B81C 1/00246 73/718 |
| 2016/0221819 A1 | 8/2016 | Smeys et al. | |

* cited by examiner

MEMS DEVICE AND MANUFACTURING METHOD THEREOF

CROSS-REFERENCE TO RELATED APPLICATIONS

This is a Continuation-in-Part Application of U.S. patent application Ser. No. 15/600,060, filed May 19, 2017 which claims benefit of China Patent Application No. 201610334198.6 filed May 19, 2016, the disclosure of which is hereby incorporated by references.

BACKGROUND OF THE INVENTION

1. Field of the Invention

The present invention relates to a microelectromechanical system (MEMS) device and manufacturing method thereof, and more particularly to a microelectromechanical system (MEMS) device for sensing multiple physical quantities and manufacturing method thereof.

2. Description of the Prior Art

Since 1970s when the concept of the MEMS (Microelectromechanical System) device had formed, the MEMS device has progress from the laboratory exploring object to become an object for integrating with a high order system. Also, it has wide applications in the popular consumer devices and exhibits amazing and stable growth. The MEMS device includes a movable MEMS element, and various functions of the MEMS device can be realized by sensing or controlling the physical quantities of the movement of the movable MEMS element.

To meet the lightweight requirement of an electronic device, a main development trend is to integrate multiple MEMS structures for sensing different physical quantities into a single MEMS device. However, different sensing principles lead to different MEMS structures for sensing different physical quantities. For example, an accelerometer needs a cap to protect a movable element to maintain the reliability of the element, whereas a pressure sensor needs to contact with the external environment to sense the pressure variation of the external environment. Therefore, multiple MEMS structures for sensing different physical quantities are difficult to be integrated in the process of a single MEMS device.

To sum up the foregoing descriptions, how to integrate multiple MEMS structures for sensing different physical quantities into a single MEMS device is the most important goal for now.

SUMMARY OF THE INVENTION

Forming different MEMS devices with conflict operations to perform different measurements in a single process are considered herein. For example, MEMS sensors, such as accelerator and gyroscope, may perform their functions without interaction with external environment. Oppositely, the operations of accelerator and gyroscope need to be isolated from external environment to prevent from being interfered or failure. Thus, it is necessary for accelerator and gyroscope to be provided with substrate and cap layer/covering for isolation. However, MEMS sensors like pressure sensor performs sensing function by the acting of medium to be measured on sensor's sensing structure. Thus, sensing structure of a pressure sensor needs to be reached by the acting of medium to be measured for performing sensing function. Accordingly, the present invention provides a manufacturing method of microelectromechanical system (MEMS) devices which include different MEMS sensors with conflict operations aforementioned. The MEMS device like a pressure sensor uses a movable element connected with a movable membrane for sensing pressure to make the movable element move with the movable membrane to sense the pressure variation of the external environment. Based on this structure, the movable membrane is provided by a cap substrate and other portion of the same cap substrate may maintain original function, such as forming a cap to protect the movable element for sensing other physical quantity like acceleration. The manufacturing method thereof can integrate a pressure sensor and a MEMS structure for sensing other physical quantity like acceleration into a single MEMS device by a single process.

An MEMS device of one embodiment of the present invention includes a first substrate, a second substrate and a third substrate. A first surface of the first substrate includes a first circuit, a second circuit and a first conductive contact. The second substrate has a second surface, a third surface, and a second conductive contact disposed on the third surface. The second substrate is disposed on the first surface of the first substrate with the second surface, and is electrically connected with the first conductive contact. The second substrate comprises a first movable element and a second movable element. The first movable element is electrically connected with the first circuit. The second movable element corresponds to the second circuit and is electrically isolated from the first movable element. The third substrate has a fourth surface and a fifth surface. The third substrate is disposed on the third surface of the second substrate with the fourth surface, and is electrically connected with the second conductive contact. The third substrate is divided into a first cap and a second cap that are electrically isolated from each other, wherein the first cap is disposed corresponding to the first movable element and isolated from the first movable element, the second cap is connected with the second movable element, and an airtight cavity is formed between the second cap and the first substrate.

A manufacturing method of a microelectromechanical system (MEMS) device by a single process includes: providing a third substrate having a fourth surface and a fifth surface, and defining multiple first connection areas on the fourth surface; forming multiple second grooves and a dividing groove on the fourth surface of the third substrate; providing a second substrate having a second surface and a third surface, and defining multiple second connection areas on the third surface; bonding the third substrate and the second substrate, wherein the multiple first connection areas are connected with the multiple second connection areas correspondingly; defining multiple third connection areas on the second surface of the second substrate; dividing the second substrate into a first movable element and a second movable element that are electrically isolated from each other, wherein the first movable element is isolated from the third substrate and one of the second grooves corresponds to the first movable element, and the second movable element is connected with the third substrate via one of the first connection areas and the corresponding connected second connection area; providing a first substrate, wherein a first surface thereof includes a first circuit and a second circuit; defining multiple fourth connection areas on the first surface of the first substrate; bonding the first substrate and the second substrate, wherein the multiple fourth connection areas are electrically connected with the multiple third connection areas correspondingly, the first circuit corresponds to the first movable element, and the second circuit corresponds to the second movable element; thinning the third substrate; and dividing, at the dividing groove, the third substrate into a first cap and a second cap and forming a first groove from the fifth surface of the second cap, wherein the first cap corresponds to the first movable element; an airtight cavity to sense a pressure variation of the external environment is formed between the second cap and the first substrate; a bottom of the first groove of the second cap is connected to the second movable element via one of the first connection areas and the corresponding connected second connection area; and the second movable element is movable with the second cap by the pressure variation of the external environment.

The objective, technologies, features and advantages of the present invention will become apparent from the following description in conjunction with the accompanying drawings wherein certain embodiments of the present invention are set forth by way of illustration and example.

DESCRIPTION OF THE PREFERRED EMBODIMENT

Various embodiments of the present invention will be described in detail below and illustrated in conjunction with the accompanying drawings. In addition to these detailed descriptions, the present invention can be widely implemented in other embodiments, and apparent alternations, modifications and equivalent changes of any mentioned embodiments are all included within the scope of the present invention and based on the scope of the Claims. In the descriptions of the specification, in order to make readers have a more complete understanding about the present invention, many specific details are provided; however, the present invention may be implemented without parts of or all the specific details. In addition, the well-known steps or elements are not described in detail, in order to avoid unnecessary limitations to the present invention. Same or similar elements in Figures will be indicated by same or similar reference numbers. It is noted that the Figures are schematic and may not represent the actual size or number of the elements. For clearness of the Figures, some details may not be fully depicted.

Figure 1:
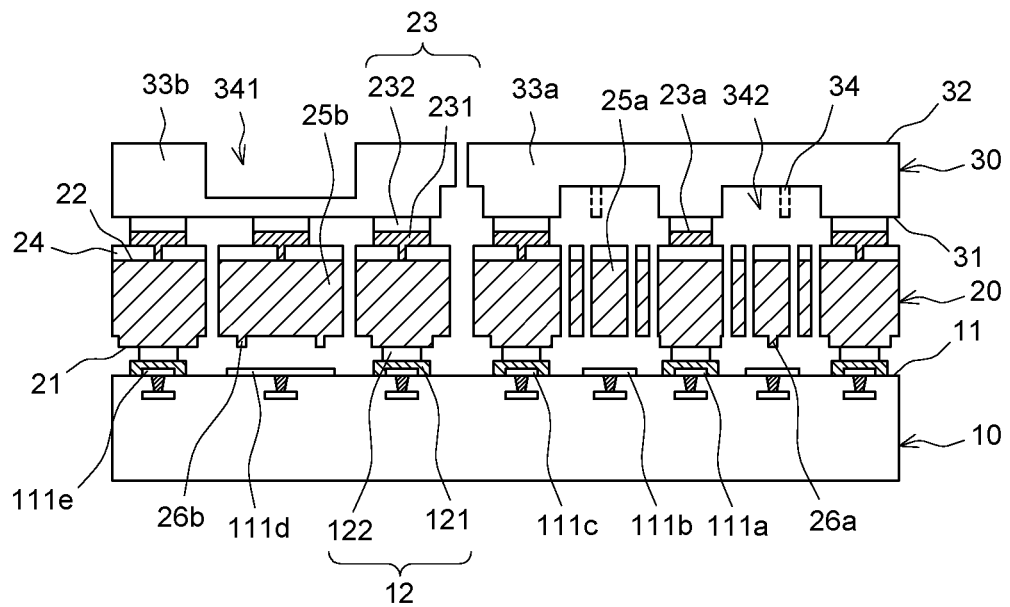
FIG. 1 is a schematic view showing a microelectromechanical system (MEMS) device of one embodiment of the present invention.

The present invention integrates a pressure sensor and an MEMS structure (such as an accelerometer) for sensing other physical quantity into a single MEMS device. Referring to FIG. 1, an MEMS device of one embodiment of the present invention includes a first substrate 10, a second substrate 20 and a third substrate 30. The first substrate 10 includes a first circuit, a second circuit and a first conductive contact 12. In one embodiment, the first substrate 10 includes at least one metal layer. In the embodiment shown in FIG. 1, the first substrate 10 includes two metal layers, and the most upper layer of the metal layers is partially exposed on the first surface 11 of the first substrate 10. The exposed metal layer can be used as the first circuit, the second circuit and the first conductive contact 12. Taking an accelerometer for example, a sensing capacitor includes a fixed electrode and a movable electrode, and the first circuit is the corresponding circuit structure, as shown by the referent numbers 111a, 111b, 111c in FIG. 1. Likewise, the second circuit may be the corresponding circuit structure of a fixed electrode and a movable electrode of a pressure sensor, as shown by the referent numbers 111d, 111e in FIG. 1. The first conductive contact 12 is the connection position between the first substrate 10 and the second substrate 20 to electrically connect the first substrate 10 and the second substrate 20. It may be understood that the first conductive contact 12 may overlap with the first circuit and the second circuit, so that the second substrate 20 may be electrically connected with the first circuit or the second circuit, as shown by the referent numbers 111a, 111c, 111e in FIG. 1. In one embodiment, the first substrate 10 may be a complementary metal oxide semiconductor substrate.

The second substrate 20 has a second surface 21, a third surface 22, and a second conductive contact 23 disposed on the third surface 22. In one embodiment, a dielectric layer 24 may be disposed between the third surface 22 of the second substrate 20 and the second conductive contact 23. For example, the dielectric layer 24 may be oxide, nitrogen or nitrogen oxide. A conductive via through the dielectric layer 24 may be disposed or not, so as to control the second conductive contact 23 to be electrically connected with the second substrate 20 or electrically isolated from the second substrate 20. For example, a second conductive contact 23a is electrically isolated from the second substrate 20. The second substrate 20 is disposed on the first surface 11 of the first substrate 10, with the second surface 21 facing the first substrate 10. In addition, the second substrate 20 is electrically connected with the first circuit and the second circuit through the first conductive contact 12. In one embodiment, the second substrate 20 may be bonded with the first substrate 10 by the eutectic bonding technology. Therefore, the first conductive contact 12 may include two kinds of material, as shown by the referent numbers 121, 122 in FIG. 1. For example, the first conductive contact 12 may include an alloy which includes at least one of aluminum, copper, germanium, indium, gold, and silicon. Not limited to this, the second substrate 20 may be bonded with the first substrate 10 by at least one technology of the fusion bond, welding, and adhesion, and electrically connected with the first substrate 10. The second substrate 20 includes a first movable element 25a and a second movable element 25b that are electrically isolated from each other. The first movable element 25a is electrically connected with the first circuit through the first conductive contact 12. Taking an accelerometer for example, the first movable element 25a can sense the physical quantity of acceleration. The second movable element 25b corresponds to the second circuit 111d.

The third substrate 30 has a fourth surface 31 and a fifth surface 32. The third substrate 30 is disposed on the third surface 22 of the second substrate 20, with the fourth surface 31 facing the second substrate 20, and is electrically connected with the second conductive contact 23. Likewise, the third substrate 30 may be bonded with the second substrate 20 by the eutectic bonding technology. Therefore, the second conductive contact 23 may include two kinds of material, as shown by the referent numbers 231, 232 in FIG. 1. For example, the second conductive contact 23 may include an alloy which includes at least one of aluminum, copper, germanium, indium, gold, and silicon. Not limited to this, the third substrate 30 may be bonded with the second substrate 20 by at least one technology of the fusion bond, welding, and adhesion, and electrically connected with the second substrate 20.

The third substrate 30 is divided into a first cap 33a and a second cap 33b that are electrically isolated from each other. The first cap 33a is disposed corresponding to the first movable element 25a, such that the first movable element 25a is arranged between the first substrate 10 and the first cap 33a. In other words, the first movable element 25a can be covered by the first cap 33a and protected. Thus, the first movable element 25a protected by the first cap 33a may be a sensing part of MEMS sensors like accelerator or gyroscope. It may be understood that the first cap 33a and the first movable element 25a are isolated from each other in case the first cap 33a should influence the movement of the first movable element 25a. In one embodiment, the fourth surface 31 of the first cap 33a opposite to the first movable element 25a has a second groove 342 to increase the distance between the first movable element 25a and the first cap 33a.

The second cap 33b is connected with the second movable element 25b, such that the second movable element 25b may move as the second cap 33b deforms. In addition, an airtight cavity is formed between the first substrate 10 and the second cap 33b. In other words, the second movable element 25b is arranged within the airtight cavity. Based on this structure, the second cap 33b may generate corresponding deformation as the pressure of the external environment changes, so as to drive the second movable element 25b to move up and down. Thus, the second movable element 25b may be regarded as a movable electrode, and form a sensing capacitor together with an opposite, fixed electrode (the second circuit 111d) to sense the pressure variation of the external environment. For example, the second movable element 25b may be electrically connected with the second cap 33b through the second conductive contact 23, and the second cap 33b may be electrically connected with the second circuit 111e through the second conductive contact 23, the second substrate 20 at both sides of the second movable element 25b, and the first conductive contact 12. It can be understood that the second movable element 25b can be supported by at least one elastic arm to increase stability of the second movable element 25b. In one embodiment, the second substrate 20 and the third substrate 30 may be single crystalline silicon.

In one embodiment, the second cap 33b has a first groove 341 which is disposed on the fifth surface 32 of the second cap 33b (i.e., the third substrate 30) to thin a portion of the second cap 33b. Preferably, a connection area between the second cap 33b and the second movable element 25b is less than an area of a bottom of the first groove 341 in case an excessive connection area should affect the deformation amount of the second cap 33b. Based on this structure, the second cap 33b is more sensitive to the pressure variation of the external environment, and has a larger deformation amount, so that it is advantageous for sensing pressure.

In one embodiment, the second surface 21 of at least one of the first movable element 25a and the second movable element 25b may be disposed with a stop bump 26a, 26b, such that a contact area between the first substrate 10 and the first movable element 25a or the second movable element 25b may be reduced to prevent the first movable element 25a or the second movable element 25b from sticking to the first substrate 10 and malfunctioning. Likewise, in one embodiment, a bottom of the second groove 342 of the first cap 33a may also be disposed with a stop bump 34 to reduce a contact area between the first movable element 25a and the first cap 33a and prevent the first movable element 25a from sticking to the first cap 33a and malfunctioning.

Figure 2:
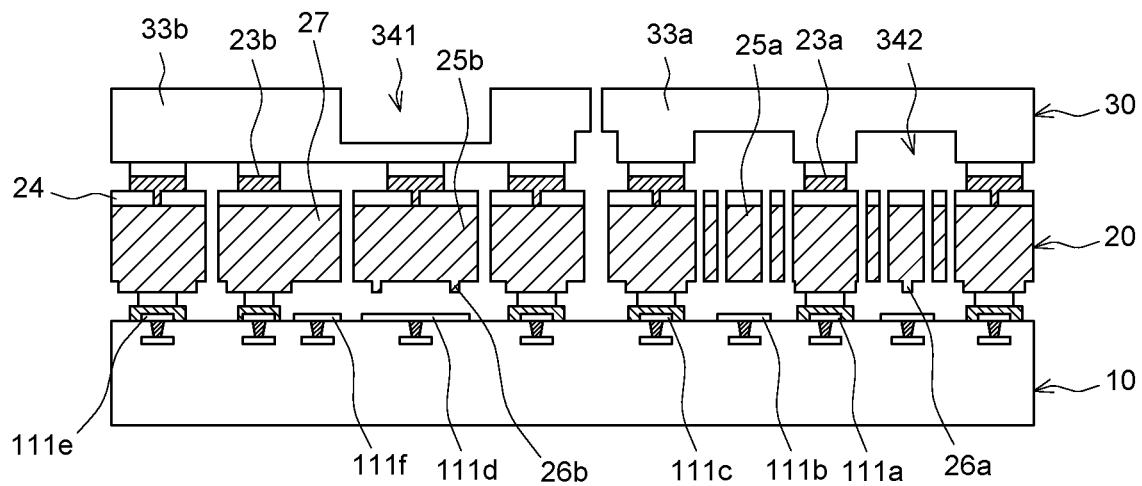
FIG. 2 is a schematic view showing a microelectromechanical system (MEMS) device of another embodiment of the present invention.

Referring to FIG. 2, an MEMS device of another embodiment of the present invention is illustrated. Compared with the embodiment shown in FIG. 1, the main difference is that in the MEMS device shown in FIG. 2, the first substrate 10 further comprises a reference circuit 111f, and the second substrate 20 further comprises a reference element 27 that is electrically isolated from the second cap 33b. For example, the second conductive contact 23b is isolated by the dielectric layer 24 and electrically isolated from the second substrate 20. Thus, the reference element 27 may not be electrically connected with the second cap 33b through the second conductive contact 23b. The reference element 27 corresponds to the reference circuit 111f to form a reference capacitance. The reference element 27 may not change as the pressure of the external environment changes. Thus, the reference capacitance is almost a constant value. A difference between the sensing capacitance sensed by the second movable element 25b and the reference capacitance is the pressure variation of the external environment, and a more accurate sensing result may be obtained.

Compared with the prior-art pressure sensor, the present invention uses the second movable element 25b connected with a movable membrane of the second cap 33b, such that the second movable element 25b may be moved with the movement of the movable membrane of the second cap 33b due to the external pressure variation. It may be understood that the first cap 33a and the second cap 33b both are constituted by the third substrate 30, and the height difference between the movable membrane of the second cap 33b and the fixed electrode (i.e., the second circuit 111d) may be compensated with the second movable element 25b, i.e., the second movable element 25b is an extension of the movable membrane of the second cap 33b and is capable of forming a sensing capacitor together with the fixed electrode to sense the pressure variation of the external environment. Based on this structure, a pressure sensor may be integrated with an MEMS structure for sensing other physical quantity into a single MEMS device. For example, the first movable element 25a and the first circuit may form an MEMS structure, such as an accelerometer, a gyroscope, a moisture meter or a magnetometer, etc.

Referring to FIG. 3a through FIG. 3l, a manufacturing method of the microelectromechanical system (MEMS) device shown in the embodiment in FIG. 2 is illustrated. Although only a single device is shown in the schematic views in FIG. 3a through FIG. 3l, it may be understood that multiple dies may be manufactured on a single substrate. Thus, the single device shown in the figures is only representative, and can not be used to limit the manufacturing method of the present invention only to be used for a single device. In the specification, manufacturing multiple dies or devices on a substrate with the wafer-level process will be fully described. After the devices are manufactured, the dicing and singulation technologies are used to produce separate device packages that are used in various applications.

Figure 3A:
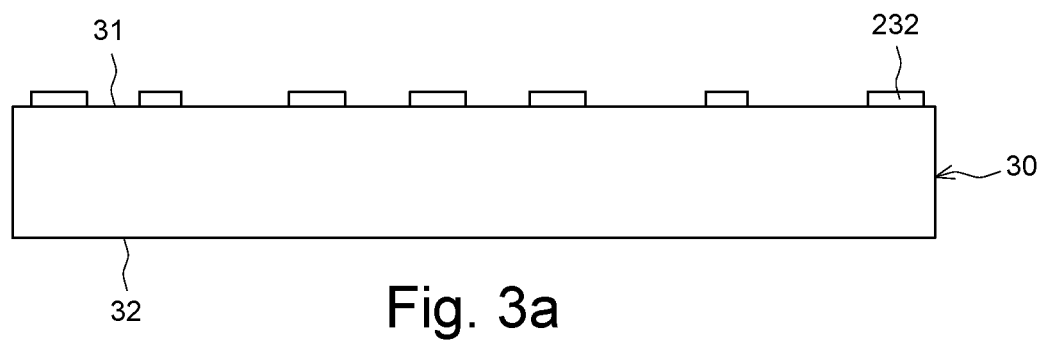
FIG. 3a through FIG. 3l are schematic views showing a manufacturing method of a microelectromechanical system device of one embodiment of the present invention.

First, a third substrate 30 is provided, which has a fourth surface 31 and a fifth surface 32. Then, multiple first connection areas 232 are defined on the fourth surface 31 of the third substrate 30, as shown in FIG. 3a. In one embodiment, the third substrate 30 may be single crystalline silicon, the material of the first connection areas 232 may be germanium, but may not be limited to this. For example, the material of the first connection areas 232 may be deposited on the fourth surface 31 of the third substrate 30 with the plating, the physical vapor deposition (PVD) or the chemical vapor deposition (CVD) process. What shown in FIG. 3a are the third substrate 30 and the patterned first connection areas 232 after an etching process. In order to illustrate the subject matter of the present invention clearly, a lithography process is not shown in FIG. 3a and will be described briefly bellow. A photoresist layer is deposited on the layer of the first connection areas 232, and the photoresist layer is patterned to form an etching mask. In the lithography process, a size of the etching mask may be controlled strictly, and the etching mask may be formed by any suitable materials that may resist the etching process for etching the layer of the first connection areas 232. Although a one-dimension sectional view is shown in FIG. 3a, those skilled in the art may understand that the first connection area 232 forms a two-dimension pattern having a specified geometry.

Figure 3B:
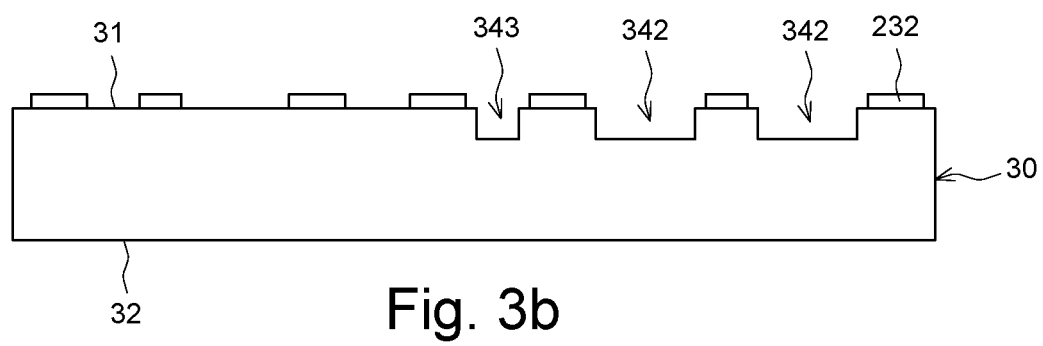

Referring to FIG. 3b, then, multiple second grooves 342 and a dividing groove 343 are formed on the fourth surface 31 of the third substrate 30. As mentioned above, the second grooves 342 correspond to the first movable element 25a to increase the distance between the third substrate 30 and the first movable element 25a. It may be understood that in the case that a sufficient distance exists between the third substrate 30 and the first movable element 25a, this step may be omitted. The dividing groove 343 is used in the subsequent process to divide the third substrate 30 to form the first cap 33a and the second cap 33b. Likewise, the dividing groove 343 may be replaced with other appropriate manner that may divide the third substrate 30. Thus, the step shown in FIG. 3b may be omitted.

Figure 3C:
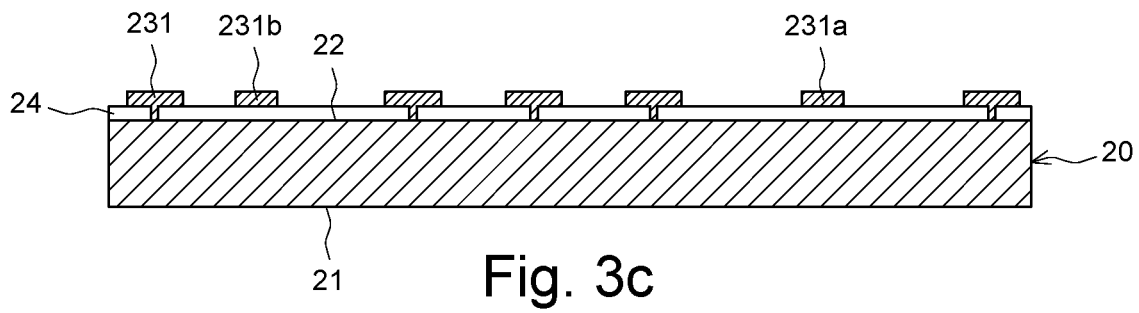

Then, a second substrate 20 is provided which has a second surface 21 and a third surface 22, and multiple second connection areas 231, 231a, 231b are defined on the third surface 22 of the second substrate 20, as shown in FIG. 3c. In one embodiment, the second substrate 20 may be single crystalline silicon, the material of the second connection areas 231 may be aluminum, but may not limited to this. Likewise, the second connection area 231 may be formed as a two-dimension pattern having a specified geometry with the processes such as deposition, lithography and etching, etc. It may be understood that, as mentioned above, a dielectric layer 24 may be used to determine if the second connection area 231 will be electrically connected with the second substrate 20. For example, in the embodiment shown in FIG. 3c, the second connection areas 231a, 231b are not electrically connected with the second substrate 20.

Figure 3D:
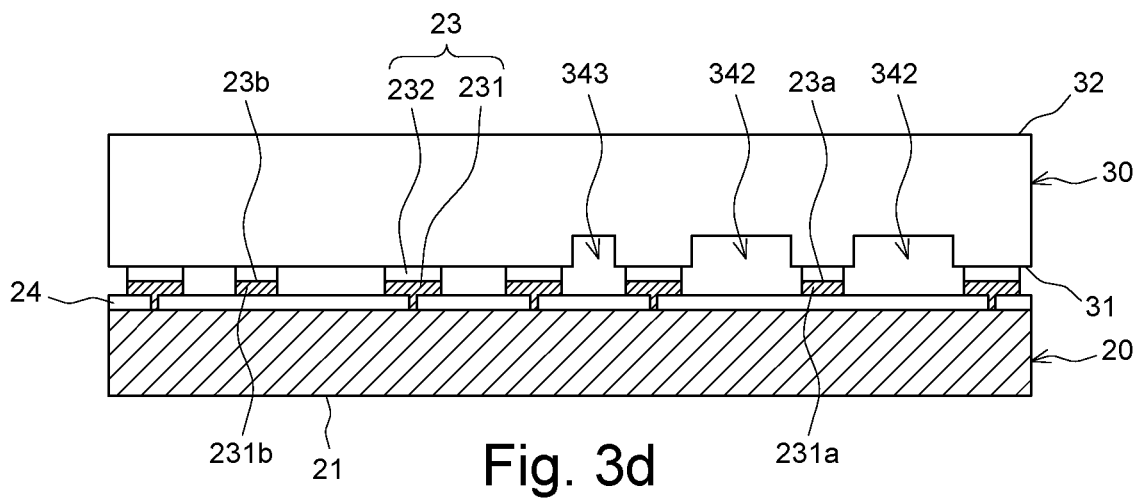

Referring to FIG. 3d, then, the first connection areas 232 of the third substrate 30 are aligned with the second connection areas 231, 231a, 231b of the second substrate 20 to bond the third substrate 30 and the second substrate 20. The bonded first connection area 232 and second connection area 231 may serve as the second conductive contact 23 between the third substrate 30 and the second substrate 20. In one embodiment, the bonding between the third substrate 30 and the second substrate 20 may be achieved with the eutectic bonding technology. For example, a bonding temperature for the third substrate 30 and the second substrate 20 is less than or equal to 450 degrees Celsius. Not limited to this, other appropriate technology may be used to bond the third substrate 30 and the second substrate 20, such as the fusion bond, welding or adhesion, etc. In one embodiment, after the bonding between the third substrate 30 and the second substrate 20 is completed, the second substrate 20 may be further thinned to an appropriate thickness. For example, the thinned second substrate 20 may have a thickness of 30 µm.

Figure 3E:
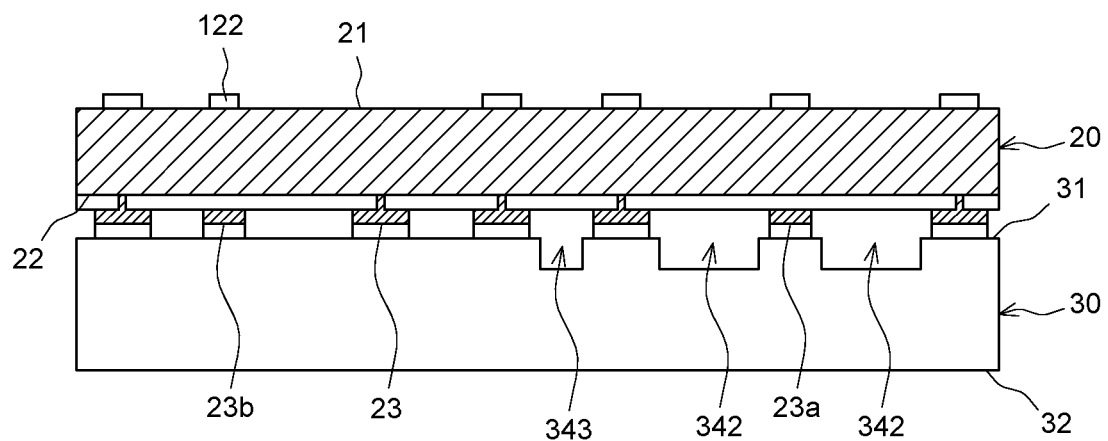

Referring to FIG. 3e, multiple third connection areas 122 are defined on the second surface 21 of the second substrate 20. In one embodiment, the material of the third connection area 122 may be gold. As mentioned above, the third connection area 122 may be formed as a two-dimension pattern having a specified geometry with the processes such as deposition, lithography and etching, etc.

Figure 3F:
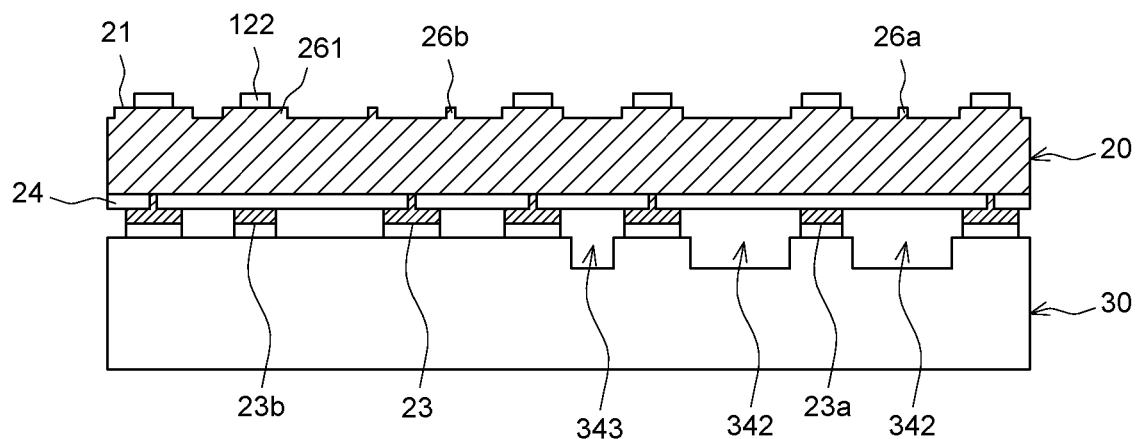

Referring to FIG. 3f, multiple posts 261 are formed on the second surface 21 of the second substrate 20 and correspond to the third connection areas 122. For example, a higher post 261 may be formed by patterning and etching the second surface 21 of the second substrate 20. In one embodiment, in this step, mechanical stop structures for one or more movable elements may be defined as well, such as stop bumps 26a, 26b. It may be understood that after the first substrate 10 is bonded subsequently, if a sufficient distance exists between the first substrate 10 and the first movable element 25a and the second movable element 25b, then the step shown in FIG. 3f may be omitted.

Figure 3G:
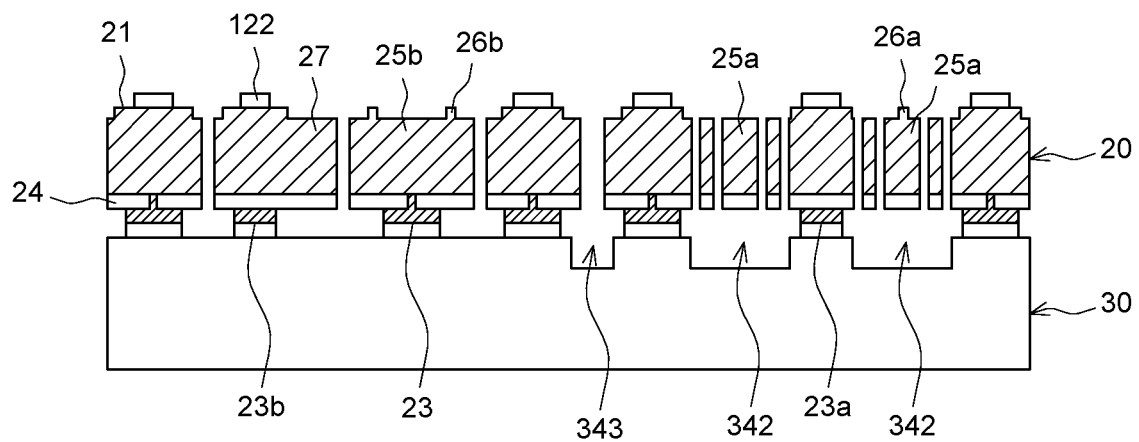

Referring to FIG. 3g, then, the second substrate 20 is divided into a first movable element 25a and a second movable element 25b that are electrically isolated from each other with the processes such as lithography and etching, etc. The first movable element 25a is isolated from the third substrate 30 to sense a physical quantity such as acceleration. The second movable element 25b is connected with the third substrate 30, and after the subsequent processes are completed, the second movable element 25b may be moved with the second cap. In one embodiment, this step can also define the reference element 27 simultaneously. It is noted that the reference element 27 is fixed to the third substrate 30 only through the second conductive contact 23b. However, the reference element 27 is electrically isolated from the third substrate 30, because the second conductive contact 23b is not electrically connected with the reference element 27 due to the isolating dielectric layer 24. In one embodiment, the foregoing elastic arm for supporting the second movable element 25b can be formed in this processing step. In other words, the elastic arm is composed of the second substrate 20.

Figure 3H:
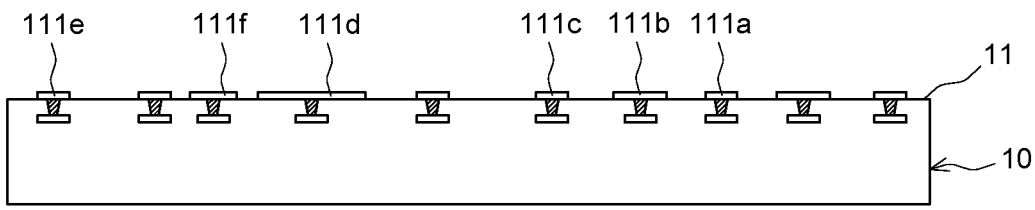
Figure 3I:
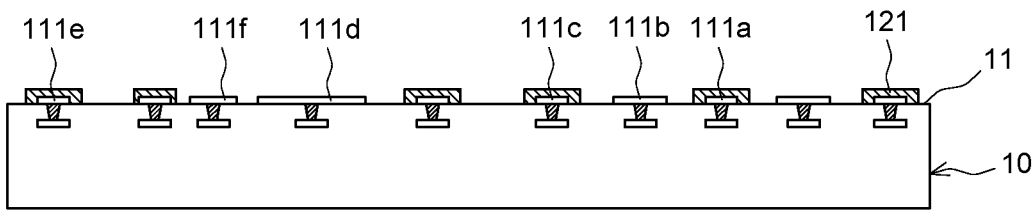

Referring to FIG. 3h, then, a first substrate 10 is provided, which includes drive circuits and/or sensing circuits, etc. Analog and/or digital circuits may be used in the first substrate 10, and may be implemented with ASIC designed elements. The first substrate 10 may be referred as the electrode substrate. In one embodiment of the present invention, the first substrate 10 may be any substrate that has an appropriate mechanical rigidity, including a complementary metal oxide semiconductor (CMOS) substrate, a glass substrate, etc. The first surface 11 of the first substrate 10 includes first circuits 111a, 111b, 111c and second circuits 111d, 111e, 111f. The detailed processes of the first substrate 10 are well known by those skilled in the art, and are omitted here. Then, multiple fourth connection areas 121 are defined on the first surface 11 of the first substrate 10, as shown in FIG. 3i. In one embodiment, the material of the fourth connection area 121 may be indium, but may not be limited to this. Likewise, the fourth connection area 121 may be formed as a two-dimension pattern having a specified geometry with the processes such as deposition, lithography and etching, etc.

Figure 3J:
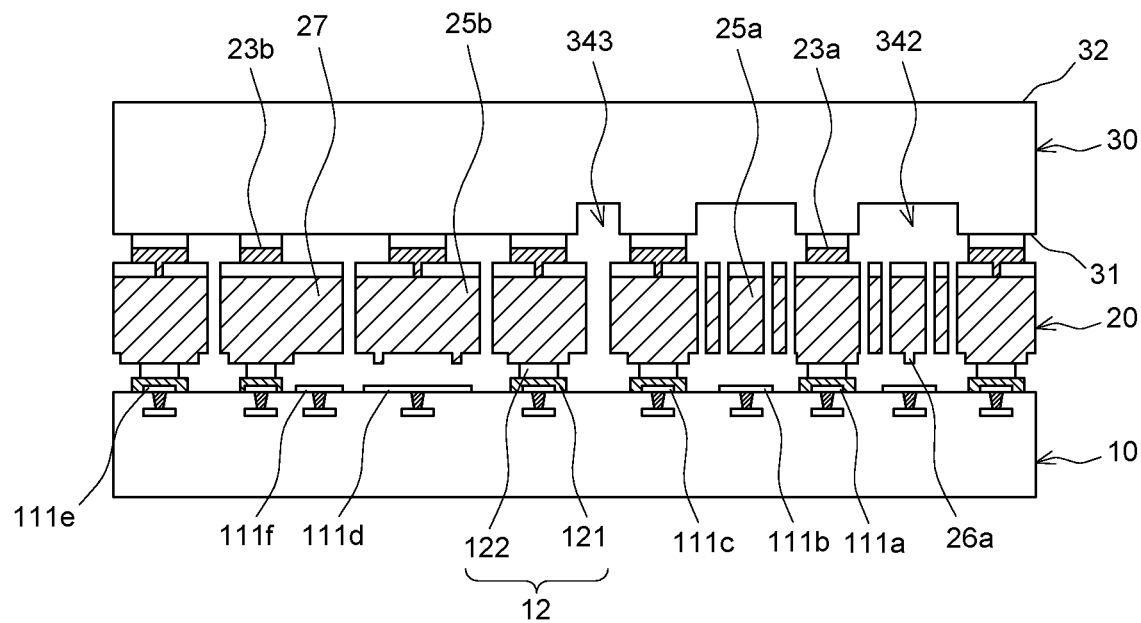

Referring to FIG. 3j, the third connection areas 122 of the second substrate 20 are aligned with the fourth connection areas 121 of the first substrate 10 to bond the second substrate 20 and the first substrate 10, and the second movable element 25b corresponds to the second circuit 111d. In the meantime, the space between the first substrate 10 and the third substrate 30 is hermetic. The bonded third connection area 122 and fourth connection area 121 may serve as the first conductive contact 12 between the second substrate 20 and the first substrate 10. For example, the first movable element 25a may be electrically connected with the first circuit 111a, 111c of the first substrate 10 through the first conductive contact 12. In one embodiment, the bonding between the second substrate 20 and the first substrate 10 may be achieved with the eutectic bonding technology. It may be understood that, to avoid the degradation of the bonding strength between the third substrate 30 and the second substrate 20, a bonding temperature for the second substrate 20 and the first substrate 10 is less than a bonding temperature for the third substrate 30 and the second substrate 20. For example, a bonding temperature for the second substrate 20 and the first substrate 10 is about 150 degrees Celsius. It is noted that other appropriate technology may be used to bond the second substrate 20 and the first substrate 10, such as the fusion bond, welding or adhesion, etc.

Figure 3K:
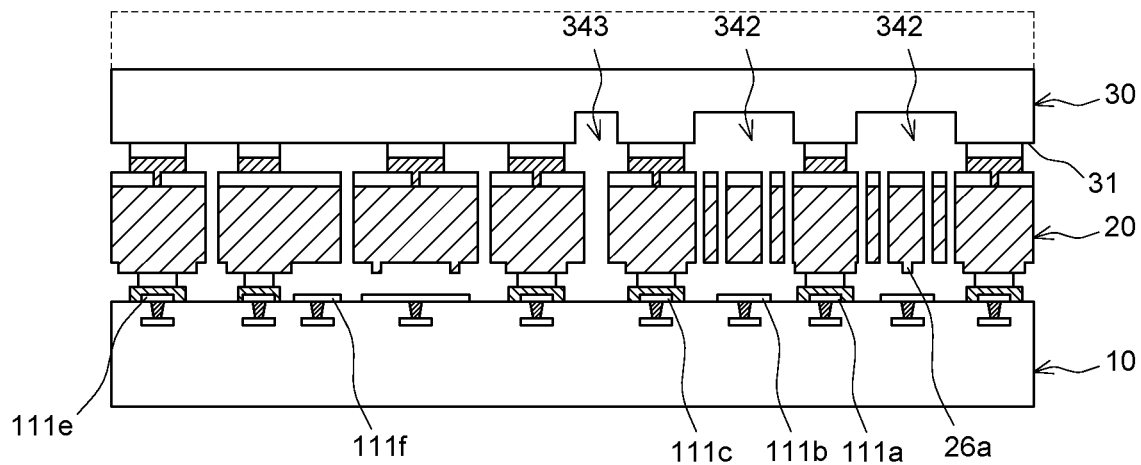
Figure 3L:
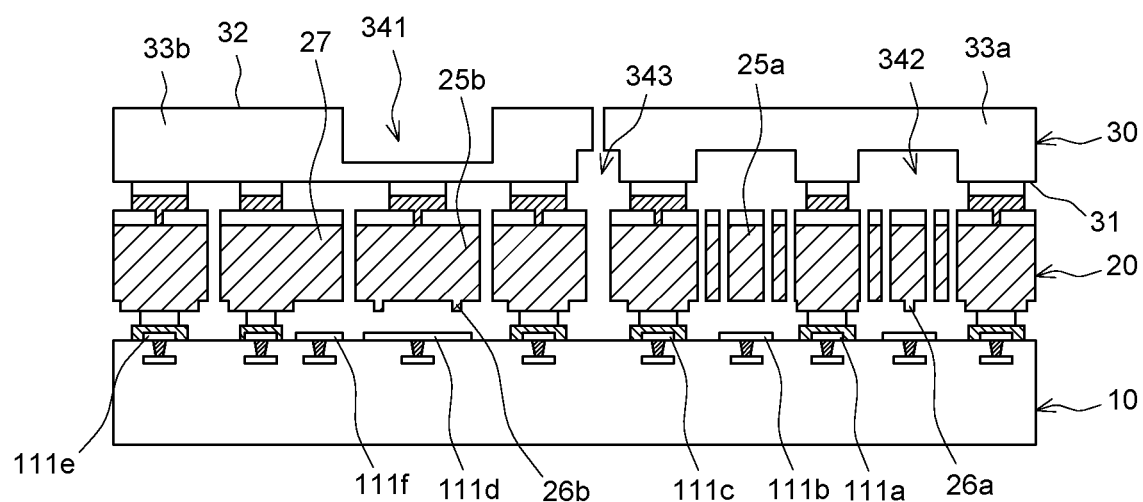

Referring to FIG. 3k, the third substrate 30 is thinned with the grinding and/or other thinning process, so as to achieve a specified thickness. Then, the third substrate 30 is divided into a first cap 33a and a second cap 33b, as shown in FIG. 3l. The first cap 33a corresponds to the first movable element 25a, and an airtight cavity is formed between the second cap 33b and the first substrate 10 to sense the pressure variation of the external environment. It is noted that the space between the first cap 33a and the first substrate 10 is also hermetic. For example, by etching the fifth surface 32 of the third substrate 30 to communicate with the dividing groove 343, the third substrate 30 may be divided. In one embodiment, a first groove 341 may be formed on the fifth surface 32 of the third substrate 30 while dividing the third substrate 30, so as to further thin an area of the second cap 33b corresponding to the second movable element 25b. In one embodiment, after further thinning, a residual thickness of the area of the second cap 33b corresponding to the second movable element 25b (i.e., the bottom of the first groove 341) is about 10 µm to 100 µm, so as to produce deformation as the pressure of the external environment changes. Preferably, a connection area between the second cap 33b and the second movable element 25b is less than an area of the bottom of the first groove 341, such that an excessive connection area that may influence the deformation amount of the second cap 33b may be avoided.

To sum up the foregoing descriptions, the microelectromechanical system (MEMS) device of the present invention uses a movable element connected with a movable membrane for sensing pressure to make the movable element move with the movable membrane to sense the pressure variation of the external environment. Based on this structure, other portion of the substrate forming the movable membrane can form a cap to protect the movable element for sensing other physical quantity. Accordingly, the MEMS device of the present invention can use a single process to manufacture a pressure sensor and a MEMS structure for sensing other physical quantity into the same substrate, i.e., to integrate them into a single MEMS device.

What is claimed is:

1. A manufacturing method of a microelectromechanical system (MEMS) device, comprising:
   providing a third substrate having a fourth surface and a fifth surface, and defining multiple first connection areas on the fourth surface;
   forming multiple second grooves and a dividing groove on the fourth surface of the third substrate;
   providing a second substrate having a second surface and a third surface, and defining multiple second connection areas on the third surface;
   bonding the third substrate and the second substrate, wherein the multiple first connection areas are connected with the multiple second connection areas correspondingly;
   defining multiple third connection areas on the second surface of the second substrate;
   dividing the second substrate into a first movable element and a second movable element that are electrically isolated from each other, wherein the first movable element is isolated from the third substrate and one of the second grooves corresponds to the first movable element, and the second movable element is connected with the third substrate via one of the first connection areas and the corresponding connected second connection area;
   providing a first substrate, wherein a first surface thereof includes a first circuit and a second circuit;
   defining multiple fourth connection areas on the first surface of the first substrate;
   bonding the first substrate and the second substrate, wherein the multiple fourth connection areas are electrically connected with the multiple third connection areas correspondingly, the first circuit corresponds to the first movable element, and the second circuit corresponds to the second movable element;
   thinning the third substrate; and
   dividing, at the dividing groove, the third substrate into a first cap and a second cap and forming a first groove from the fifth surface of the second cap, wherein
   the first cap corresponds to the first movable element;
   an airtight cavity to sense a pressure variation of the external environment is formed between the second cap and the first substrate;
   a bottom of the first groove of the second cap is connected to the second movable element via one of the first connection areas and the corresponding connected second connection area; and
   the second movable element is movable with the second cap by the pressure variation of the external environment.

2. The manufacturing method of a microelectromechanical system device according to claim 1, wherein the step of providing the second substrate comprises forming a dielectric layer on the second substrate to determine whether one of the multiple second connection areas is electrically isolated from the second substrate or not, and the step for forming the first movable element and the second movable element further defines a reference element that is connected with the third substrate through the second connection area electrically isolated from the second substrate and corresponds to a reference circuit of the first substrate.

3. The manufacturing method of a microelectromechanical system device according to claim 1, wherein a connection area between the second cap and the second movable element is less than an area of the bottom of the first groove.

4. The manufacturing method of a microelectromechanical system device according to claim 1, further comprising:
   forming multiple posts on the second surface of the second substrate, wherein the multiple posts correspond to the third connection areas.

5. The manufacturing method of a microelectromechanical system device according to claim 4, wherein the step for forming the posts further comprises forming a stop bump which is correspondingly disposed on the second surface of at least one of the first movable element and the second movable element.

6. The manufacturing method of a microelectromechanical system device according to claim 1, wherein the first substrate includes a complementary metal oxide semiconductor substrate.

7. The manufacturing method of a microelectromechanical system device according to claim 1, wherein the second substrate or the third substrate includes single crystalline silicon.

8. The manufacturing method of a microelectromechanical system device according to claim 1, wherein the bonding between the third substrate and the second substrate is achieved by at least one of the eutectic bonding, fusion bond, welding, and adhesion.

9. The manufacturing method of a microelectromechanical system device according to claim 1, wherein the bonding between the first substrate and the second substrate is achieved by at least one of the eutectic bonding, fusion bond, welding, and adhesion.

10. The manufacturing method of a microelectromechanical system device according to claim 1, wherein the bonding area between the first connection area and the second connection area includes an alloy which includes at least one of aluminum, copper, germanium, indium, gold, and silicon.

11. The manufacturing method of a microelectromechanical system device according to claim 1, wherein the bonding area between the third connection area and the fourth connection area includes an alloy which includes at least one of aluminum, copper, germanium, indium, gold, and silicon.

12. The manufacturing method of a microelectromechanical system device according to claim 1, wherein a bonding temperature for the first substrate and the second substrate is less than a bonding temperature for the third substrate and the second substrate.

13. The manufacturing method of a microelectromechanical system device according to claim 1, wherein a bonding temperature for the third substrate and the second substrate is less than or equal to 450 degrees Celsius.

* * * * *